(12) United States Patent
Lee et al.

(10) Patent No.: US 9,130,194 B2
(45) Date of Patent: Sep. 8, 2015

(54) DONOR SUBSTRATE FOR TRANSFER AND MANUFACTURING METHOD OF ORGANIC LIGHT EMITTING DIODE DISPLAY

(71) Applicant: Samsung Display Co., Ltd., Yongin, Gyeonggi-do (KR)

(72) Inventors: Yeon-Hwa Lee, Yongin (KR); Kwan-Hyun Cho, Yongin (KR); Ji-Young Choung, Yongin (KR); Joon-Gu Lee, Yongin (KR); Jin-Baek Choi, Yongin (KR); Hyun-Sung Bang, Yongin (KR); Young-Woo Song, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/134,568

(22) Filed: Dec. 19, 2013

(65) Prior Publication Data
US 2015/0014643 A1  Jan. 15, 2015

(30) Foreign Application Priority Data

Jul. 12, 2013 (KR) .................. 10-2013-0082146

(51) Int. Cl.
H01L 51/52 (2006.01)
H01L 27/32 (2006.01)
H01L 51/56 (2006.01)
C23C 14/04 (2006.01)

(52) U.S. Cl.
CPC .......... *H01L 51/5271* (2013.01); *C23C 14/048* (2013.01); *H01L 27/3244* (2013.01); *H01L 51/56* (2013.01)

(58) Field of Classification Search
CPC ...................................... H01L 31/042
USPC ...................................... 257/40, 98
See application file for complete search history.

(56) References Cited

U.S. PATENT DOCUMENTS

| 7,108,949 | B2 * | 9/2006 | Kim et al. ............ 430/200 |
| 7,132,140 | B2 * | 11/2006 | Nguyen et al. ............ 428/32.77 |
| 8,012,298 | B2 * | 9/2011 | Yoo et al. ............ 156/272.8 |
| 8,362,687 | B2 * | 1/2013 | Park ............ 313/503 |
| 2006/0051533 | A1 * | 3/2006 | Song et al. ............ 428/32.81 |
| 2009/0075214 | A1 * | 3/2009 | Hirakata et al. ............ 430/319 |
| 2009/0104721 | A1 * | 4/2009 | Hirakata et al. ............ 438/29 |
| 2009/0169809 | A1 * | 7/2009 | Yokoyama et al. ........... 428/138 |
| 2009/0266479 | A1 * | 10/2009 | Chung et al. ............ 156/247 |
| 2010/0084676 | A1 | 4/2010 | Tanaka |

FOREIGN PATENT DOCUMENTS

| KR | 10-2008-0011829 | 2/2008 |
| KR | 10-2010-0006226 | 1/2010 |

OTHER PUBLICATIONS

Lee et al. "The origin of the hole injection improvements at indium tin oxide/molybdenum trioxide/N,N-bis,1-naphthyl . . . -N,N-diphenyl-1,1-biphenyl-4,4-diamine interfaces" Applied Physics Letters 93, 043308 2008.*

* cited by examiner

*Primary Examiner* — Yu-Hsi D Sun
*Assistant Examiner* — Chi-Hua Yang
(74) *Attorney, Agent, or Firm* — Knobbe Martens Olson & Bear LLP

(57) ABSTRACT

A donor substrate includes: a support layer; a first light absorption layer disposed on the support layer; a buffer layer disposed on the first absorption layer; a second light absorption layer disposed on the buffer layer; and a transfer layer disposed on the second absorption layer, wherein the buffer layer includes a transparent oxide film.

11 Claims, 9 Drawing Sheets

DONOR SUBSTRATE FOR TRANSFER AND MANUFACTURING METHOD OF ORGANIC LIGHT EMITTING DIODE DISPLAY

CROSS-REFERENCE TO RELATED APPLICATIONS

This application claims priority to, and the benefit of, Korean Patent Application No. 10-2013-0082146 filed in the Korean Intellectual Property Office on Jul. 12, 2013, the entire contents of which are incorporated herein by reference.

BACKGROUND

1. Field

The present disclosure relates to a donor substrate for transfer, and a manufacturing method of an organic light emitting diode (OLED) display.

2. Description of the Related Technology

A display device displays an image by using a combination of light emitted from a plurality of pixels. In an organic light emitting diode (OLED) display, each pixel is formed of a pixel circuit, and an organic light emitting diode of which operation is controlled by the pixel circuit. The organic light emitting diode includes a pixel electrode, an organic emission layer, and a common electrode.

One of the pixel electrode and the common electrode is a hole injection electrode (anode) and the other is an electron injection electrode (cathode). Holes injected from the anode and electrons injected from the cathode are combined in the organic emission layer to generate excitons, and the excitons discharge energy to emit light.

Methods of forming an organic emission layer includes a deposition method using a metal mask, a printing method using an inkjet or nozzle printer, and a thermal transfer method using a donor substrate for transfer. Although the thermal transfer method has a relatively simple process, a light absorptance amount of the thermal transfer method is not high since a material such as molybdenum or chromium for forming a light-heat conversion layer has reflectivity even if it is low reflectivity.

Accordingly, the light-heat conversion layer does not absorb energy transferred from a light source sufficiently so that a transfer rate drops when an organic emission layer is formed, thereby deteriorating the resolution.

The above information disclosed in this Background section is only for enhancement of understanding of the background of the invention and therefore it may include information that does not form the prior art that is already known in this country to a person of ordinary skill in the art.

SUMMARY OF CERTAIN INVENTIVE ASPECTS

The present disclosure has been made in an effort to provide a donor substrate for transfer and a manufacturing method of an organic light emitting diode (OLED) display which improve a transfer rate of an organic material.

One embodiment provides a donor substrate for transfer including: a support layer; a first light absorption layer disposed on the support layer; a buffer layer disposed on the first absorption layer; a second light absorption layer disposed on the buffer layer; and a transfer layer disposed on the second absorption layer, wherein the buffer layer includes a transparent oxide film.

The donor substrate may further include a protection film disposed on the second absorption layer.

Each of the first absorption layer and the second absorption layer may include at least one of molybdenum, chromium, tungsten, or titanium.

The buffer layer may include at least one of an indium-tin oxide film, an indium-zinc oxide film, or an oxide film comprising silicon.

The transfer layer may include an organic light emitting material.

The donor substrate may further include a reflection layer disposed on the support layer, wherein the reflection layer is patterned to form an opening, and a light absorption layer is disposed in the opening, the light absorption layer including the first absorption layer, the buffer layer, and the second absorption layer.

Another embodiment provides a method of manufacturing an organic light emitting diode (OLED) display, including: forming a donor substrate including a support layer, a light absorption layer disposed on the support layer, and a transfer layer disposed on the light absorption layer, the light absorption layer including a first absorption layer, a buffer layer, and a second absorption layer, wherein the buffer layer comprises a transparent oxide film; forming a pixel definition film and a pixel electrode on a transfer substrate; disposing the donor substrate on the transfer substrate to allow the transfer layer and the pixel electrode to face each other; and irradiating light to the donor substrate and forming an organic emission layer by transferring the transfer layer on the pixel electrode by heat of the light absorption layer.

The method of manufacturing may further include forming a reflection layer on the donor substrate, wherein the reflection layer is patterned to form an opening, and the light absorption layer is formed in the opening.

The method of manufacturing may further include forming a protection layer on the light absorption layer.

The first absorption layer and the second absorption layer may each be formed of at least one of molybdenum, chromium, tungsten, or titanium.

The buffer layer may be formed of at least one of an indium-tin oxide film, an indium-zinc oxide film, or an oxide film comprising silicon.

The transfer layer may include an organic light emitting material.

A wavelength of light may range from about 400 nanometers to about 800 nanometers in the irradiating light to the donor substrate.

In accordance with embodiments, it is possible to improve light absorptance by forming a double-layer light absorption layer structure and interposing a transparent oxide film between light absorption layers having low reflectivity, thereby improving a light absorption rate through re-absorption of light that is not absorbed but is reflected or scattered.

DETAILED DESCRIPTION OF CERTAIN INVENTIVE EMBODIMENTS

Figure 1:
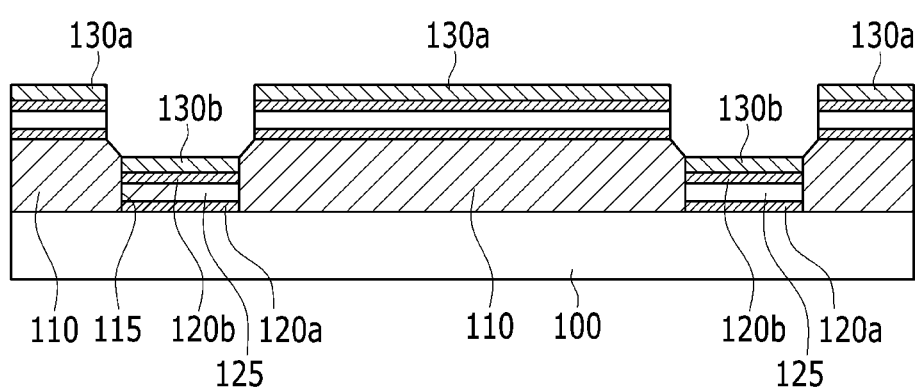
FIG. 1 is a cross-sectional view showing a donor substrate in accordance with an embodiment.

Certain embodiments will be described in detail with reference to the attached drawings. The present invention may be modified in many different forms, and should not be construed as being limited to the embodiments set forth herein. Rather, the embodiments are provided so that this disclosure will be thorough and complete, and will fully convey the concept of the present invention to those skilled in the art.

In the drawings, the thickness of layers and regions may be exaggerated for clarity. In addition, when a layer is described to be formed on another layer or on a substrate, the layer may be formed on the other layer or on the substrate, or a third layer may be interposed between the layer and the other layer or the substrate. Like numbers generally refer to like elements throughout the specification.

FIG. 1 is a cross-sectional view showing a donor substrate in accordance with an embodiment.

Referring to FIG. 1, a reflection layer 110, light absorption layers 120a and 120b (or collectively referred to as 120), a buffer layer 125, and transfer layers 130a and 130b may be formed on a support layer 100 of the donor substrate 10.

The support layer 100 may include a high light-transmissive material such as a transparent polymer material, including, for example, glass, polyethylene terephthalate (PET), polyethylene naphthalate (PEN), polyethylene (PE), or polycarbonate (PC).

The reflection layer 110 may include a highly light-reflective metal material, including, for example, silver (Ag) or an alloy including silver. In the case of using light of long wavelengths, the constituent material of the reflection layer 110 may include, for example, gold (Au), copper (Cu), or an alloy thereof.

The light absorption layers 120a and 120b serve to convert incident light into heat, and may include a highly light-absorptive material, including, for example, chromium (Cr), molybdenum (Mo), titanium (Ti), tungsten (W), aluminum oxide, aluminum sulfide, or an alloy thereof. The light absorption layers 120 may also include carbon (C) or an infrared dye.

The light absorption layers 120a and 120b include a first absorption layer 120a disposed on the support layer 100 and a second absorption layer 120b disposed on the first absorption layer 120a, and the buffer layer 125 is provided between the first absorption layer 120a and the second absorption layer 120b.

The buffer layer 125 may include a transparent oxide film such as, for example, an indium-tin oxide film, an indium-zinc oxide film, or an oxide film including silicon.

The transfer layers 130a and 130b may be formed on the entire surface of the support layer 100 to cover the light absorption layers 120a and 120b. The transfer layers 130a and 130b are separated from the support layer 100 by heat energy supplied from the light absorption layers 120a and 120b to be transferred to a target substrate (such as for example the substrate of the OLED display). The transfer layers 130a and 130b may include an organic light emitting material.

In accordance with another embodiment, the transfer layers 130a and 130b may be formed of the same material as that of a hole injection layer (HIL), a hole transport layer (HTL), an electron transport layer (ETL), or an electron injection layer (EIL). In such embodiments, one of the HIL, the HTL, the ETL, and the EIL can be formed on the target substrate by using the donor substrate 10 for transfer.

The reflection layer 110 serves to reflect light emitted to the donor substrate 10 for transfer. The reflection layer 110 may include, for example, aluminum, an aluminum alloy, silver, a silver alloy, or the like. The reflection layer 110 is patterned to form an opening 115 on the support layer 100. The first absorption layer 120a, the buffer layer 125, the second absorption layer 120b, and the transfer layer 130a or 130b are disposed in the opening 115.

As shown in FIG. 1, material layers of the first absorption layer 120a, the buffer layer 125, and the second absorption layer 120b are formed on the reflection layer 110. However, the transfer layer 130a may be directly disposed on the reflection layer 110 according to manufacturing methods omitting these material layers.

Figure 2:
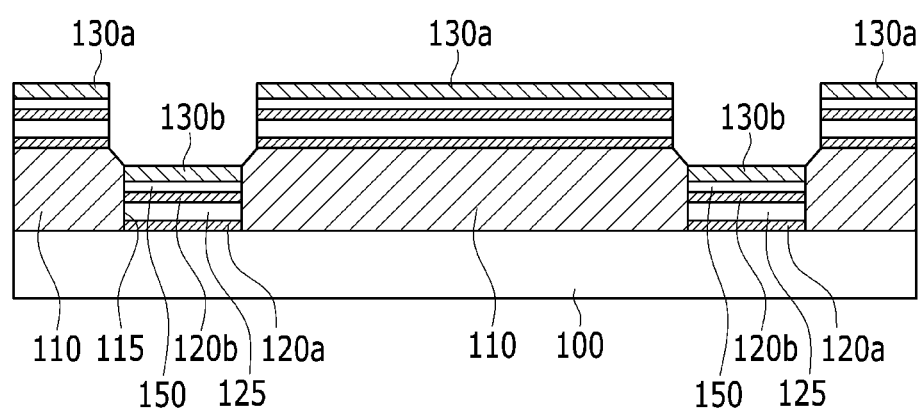
FIG. 2 is a cross-sectional view showing a donor substrate in accordance with a modification of an embodiment.

FIG. 2 is a cross-sectional view showing a donor substrate in accordance with a modification of an embodiment.

The modification of FIG. 2 has roughly the same structure as that of the embodiment of FIG. 1. However, in the modification, a protection layer 150 is provided between the second absorption layer 120b and the transfer layer 130b. The protection layer 150 may include, for example, a transparent oxide film such as an indium-tin oxide film, an indium-zinc oxide film, or an oxide film including silicon. The protection layer 150 serves to prevent deformation of the second absorption layer 120b.

Figure 3:
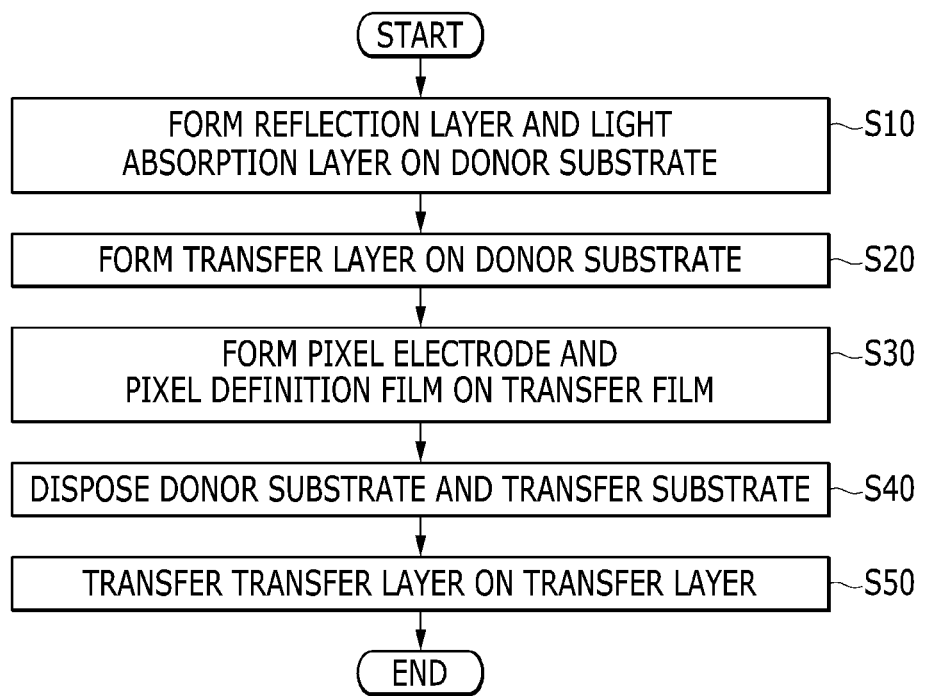
FIG. 3 is a flowchart showing a manufacturing method of an organic light emitting diode (OLED) display in accordance with an embodiment.

FIG. 3 is a flowchart showing a manufacturing method of an organic light emitting diode (OLED) display in accordance with an embodiment.

Referring to FIG. 3, an embodiment of the manufacturing method includes forming a reflection layer and light absorption layers on the donor substrate (S10), and forming a transfer layer on surfaces of the light absorption layers and the reflection layer (S20).

For example, the reflection layer may be formed with an opening on the donor substrate by a photo process to reflect light emitted from a light emitting unit. The opening may be formed corresponding to a pixel pattern of a transfer substrate.

The light absorption layers, which absorb light emitted from the light emitting unit and convert it into heat energy, may be formed in the opening, and the transfer layer may be formed on the light absorption layer. As described above with reference to FIG. 1 and FIG. 2, the light absorption layers may be formed in such a way that the buffer layer including a transparent oxide film is provided therebetween.

The manufacturing method of an OLED display further includes forming a pixel electrode and a pixel definition film on the transfer layer (S30).

The pixel electrode may be formed to correspond to the transfer layer formed in the opening in the donor substrate, and the pixel definition film may be formed to correspond to the reflection layer of the donor substrate to serve as a barrier rib for partitioning a pixel area between pixel electrodes.

The manufacturing method of an OLED display further includes disposing the donor substrate and the transfer substrate to allow the transfer layer of the donor substrate and the pixel area of the transfer substrate to correspond to each other (S40).

The manufacturing method of an OLED display further includes disposing a light emitting unit in a back surface of the donor substrate to irradiate light to the donor substrate and transferring the transfer layer onto the transfer layer (S50).

The transfer layer transferred to the transfer substrate forms a light emitting layer of the OLED display.

Hereinafter, a method of disposing the donor substrate and the transfer substrate and transferring the transfer layer onto the transfer substrate will be described with reference to FIG. 4 to FIG. 7.

FIG. 4 to FIG. 7 are cross-sectional views showing the manufacturing method of the OLED display in accordance with an embodiment.

Figure 4:
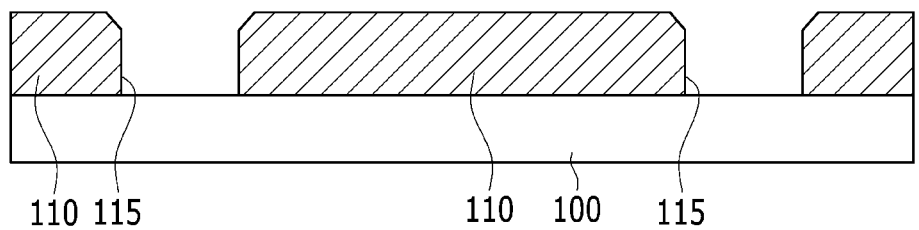
FIG. 4 to FIG. 7 are cross-sectional views showing the manufacturing method of the OLED display in accordance with an embodiment.

Referring to FIG. 4, a reflective material is formed on the support layer 100 and then patterned to form the reflection layer 110 with the opening 115. As described above with reference to FIG. 1 and FIG. 2, the reflection layer 110 may be formed of a highly light-reflective metal material, such as, for example, silver (Ag) or an alloy including silver.

Figure 5:
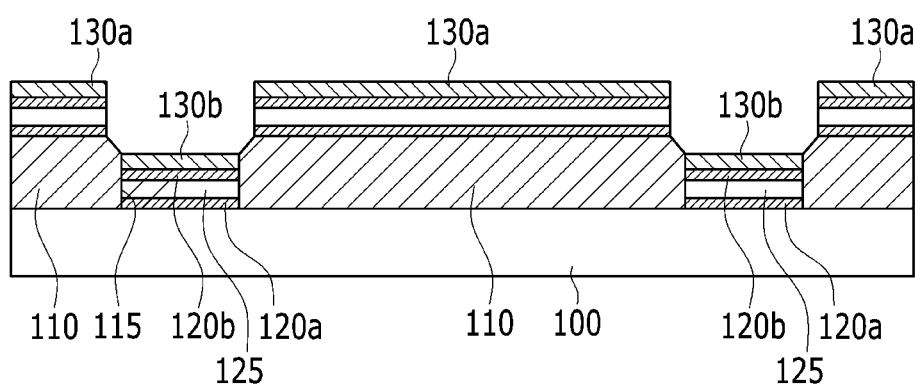

Referring to FIG. 5, a light absorption layer including the first absorption layer 120a, the buffer layer 125, and the second absorption layer 120b is formed in the opening 115. As shown in FIG. 5, the light absorption layer is formed in the opening 115, and the same material layer as the light absorption layer is formed on the reflection layer 110. However, the same material layer as the light absorption layer formed on the reflection layer 110 may be etched and removed.

The transfer layers 130a and 130b are formed on the reflection layer 110 and the second absorption layer 120b.

The light absorption layers 120a and 120b may include a highly light-absorptive material, such as, for example, chromium (Cr), molybdenum (Mo), titanium (Ti), tungsten (W), aluminum oxide, aluminum sulfide, or an alloy thereof, and the buffer layer 125 may include a transparent oxide film such as, for example, an indium-tin oxide film, an indium-zinc oxide film, or a oxide film including silicon.

The transfer layers 130a and 130b may include an organic light emitting material.

Figure 6:
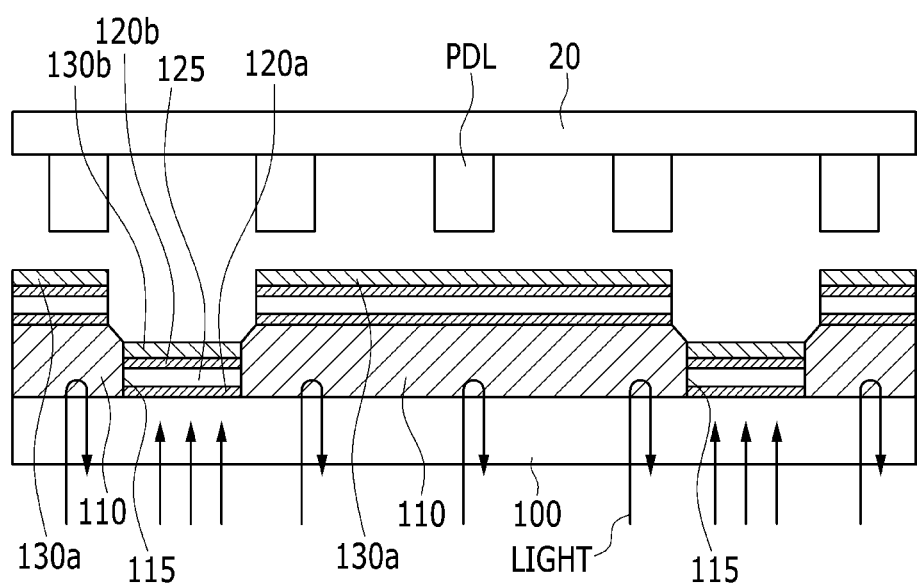

Referring to FIG. 6, a pixel definition film (PDL) is formed on a transfer substrate 20. Further, although not shown, the PDL may partition a pixel area, and a pixel electrode may be formed in the pixel area.

The donor substrate 10 and the transfer substrate 20 are arranged in such a way so as to allow the transfer layer 130b of the donor substrate 10 to correspond to the pixel area of the transfer substrate 20. Next, light emitted from a light emitting unit (not shown) is controlled to be irradiated to the donor substrate 10. The light is reflected in the reflection layer 110 and partially absorbed, reflected, and scattered while it travels through the first absorption layer 120a, the buffer layer 125, and the second absorption layer 120b formed in the opening 115. The light that is not absorbed in the first absorption layer 120a but is reflected and scattered may travel to the second absorption layer 120b through the buffer layer 125 and be absorbed or re-reflected therein to be absorbed in the first absorption layer 120a, thereby improving a light absorption rate thereof.

Figure 7:
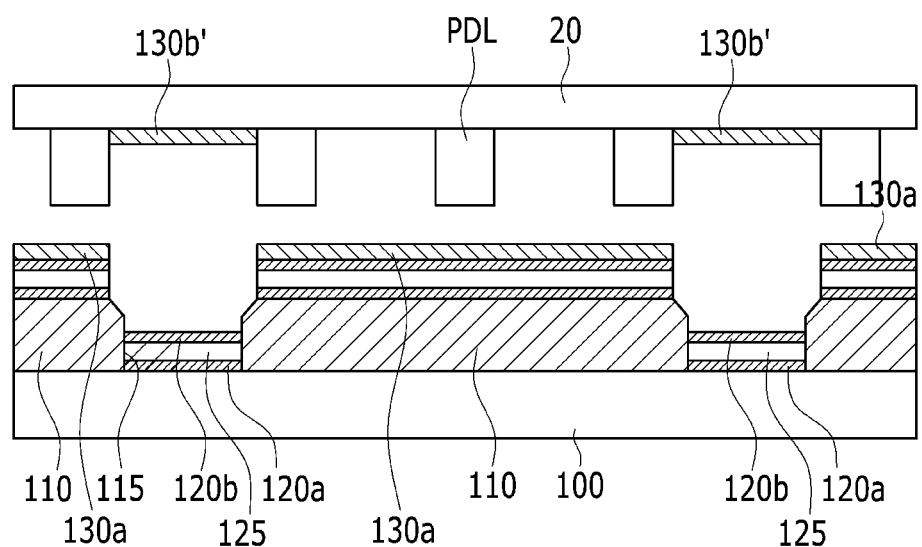

Referring to FIG. 7, energy of the light passing through the first absorption layer 120a, the buffer layer 125, and the second absorption layer 120b is converted into heat energy. A material of the transfer layer is transferred to the transfer substrate 20 by the converted heat energy to form a light emitting layer 130b'.

Figure 8:
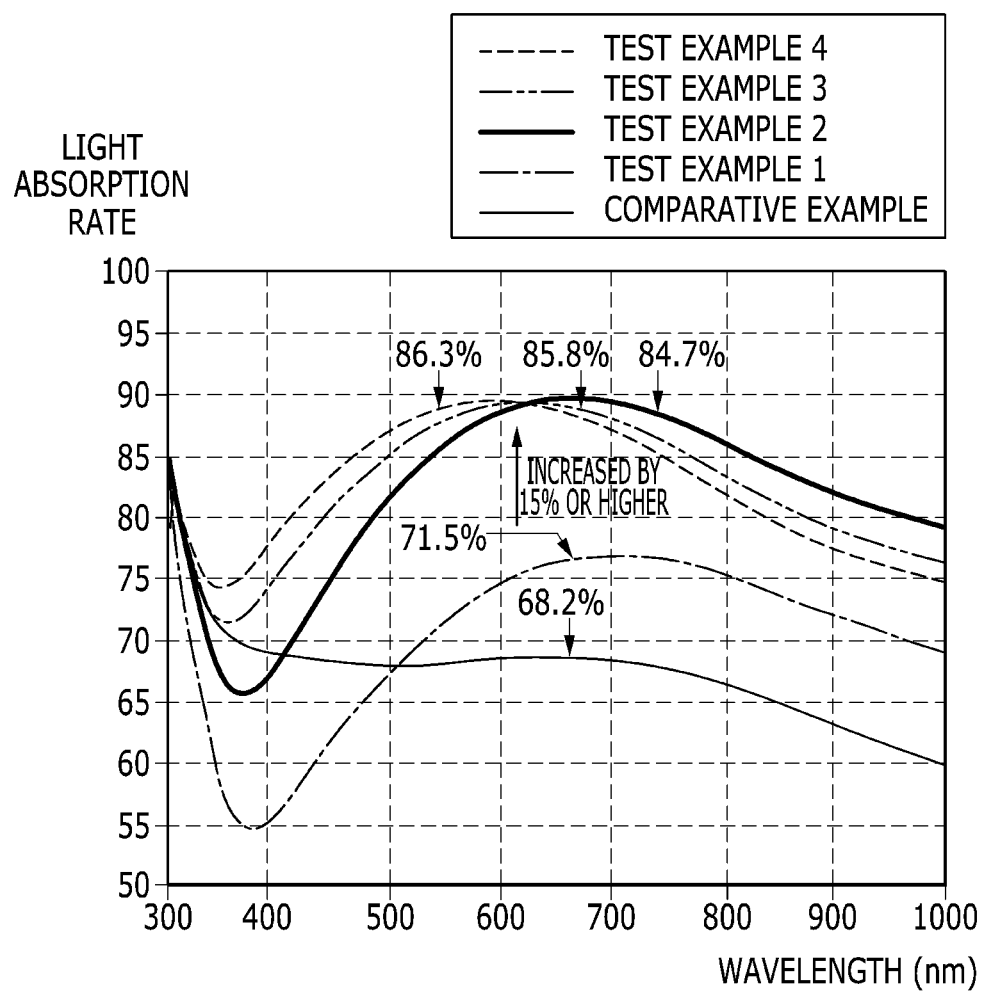
FIG. 8 is a graph showing light absorptance according to wavelengths in Test Examples and a Comparative Example.

FIG. 8 is a graph showing light absorptance according to wavelengths in Test Examples and a Comparative Example.

In FIG. 8, the Comparative Example includes a light absorption layer which is formed in double layers of molybdenum 100 nm/ITO 10 nm. Test Example 1 includes a light absorption layer which is formed in a multilayer of molybdenum 15 nm/ITO 50 nm/molybdenum 25 nm. Test Example 2 includes a light absorption layer which is formed in a multilayer of molybdenum 4 nm/ITO 70 nm/molybdenum 35 nm/ITO 10 nm, and Test Example 3 includes a light absorption layer which is formed in a multilayer of molybdenum 4 nm/ITO 60 nm/molybdenum 35 nm/ITO 10 nm. Test Example 4 includes a light absorption layer which is formed in a multilayer of molybdenum 4 nm/ITO 55 nm/molybdenum 35 nm/ITO 10 nm.

Referring to FIG. 8, it can be seen that most wavelengths of light ranging from about 400 nm to about 800 nm show a higher light absorption rate in the light absorption layer formed in the multilayer in Test Example 1 as compared with the light absorption layer formed in the double layers in Comparative Example. In a test for optimizing the thickness of the light absorption layer, it can be seen that the thickness is increased by 25% or higher as compared with Comparative Example, and as a result, the maximum of the light absorption rate reaches 86.3%.

Figure 9:
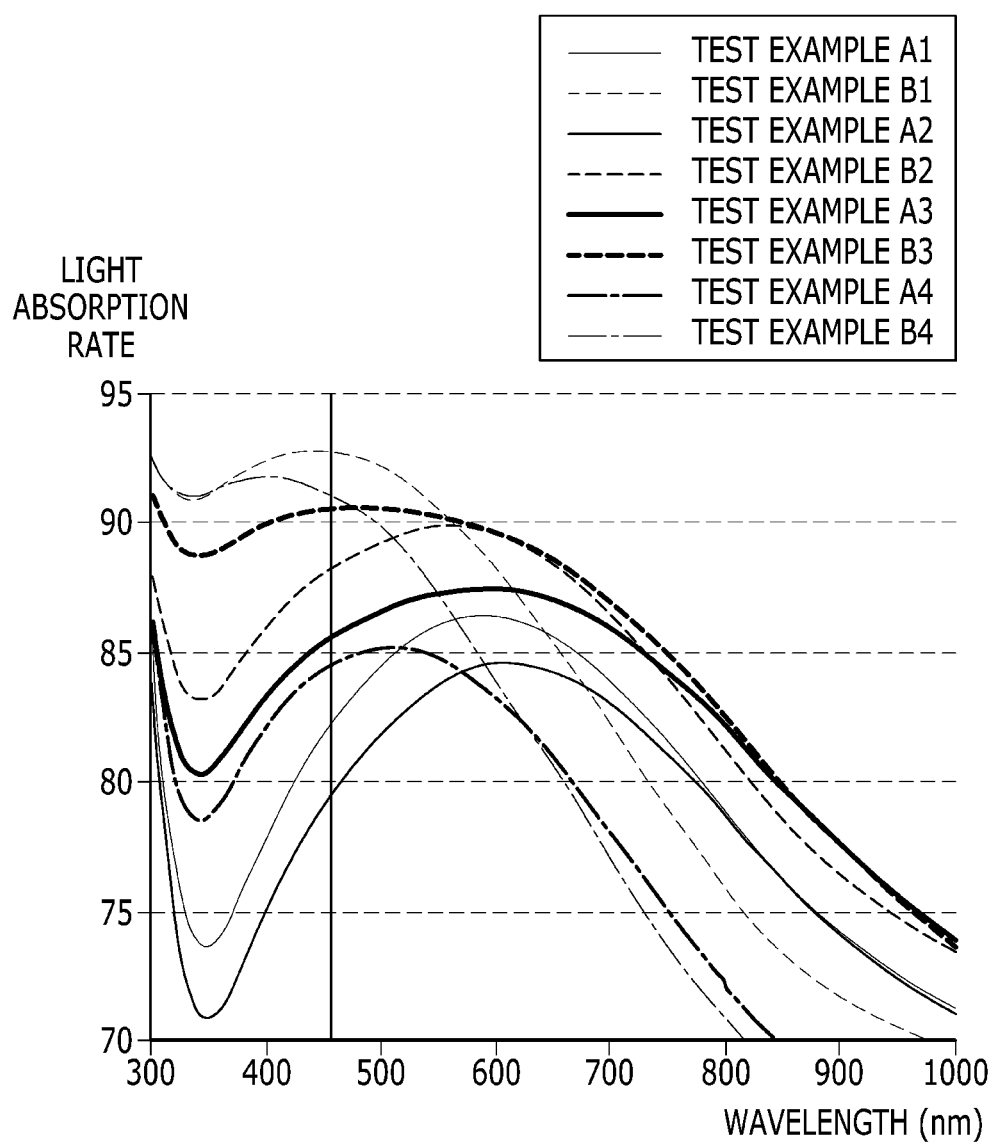
FIG. 9 is a graph showing light absorptance according to materials of a buffer layer in Test Examples.

FIG. 9 is a graph showing light absorptance according to materials of a buffer layer in Test Examples.

In accordance with embodiments, the buffer layer may be formed of an indium-tin oxide film or an indium-zinc oxide film. Alternatively, the buffer layer may be formed of a silicon dioxide ($SiO_2$) film. FIG. 9 shows light absorption rates according to Test Examples A (A1 to A4) in which the first absorption layer and the second absorption layer are formed of molybdenum, the protection layer is formed of ITO, and the buffer layer is formed of ITO, and Test Examples B (B1 to B4) in which the buffer layer is formed of an oxide film including silicon.

Specifically, in Test Example A1, a light absorption layer was formed in a multilayer of molybdenum 4 nm/ITO 55 nm/molybdenum 35 nm/ITO 10 nm. In Test Example A2, a light absorption layer was formed in a multilayer of molybdenum 6 nm/ITO 55 nm/molybdenum 35 nm/ITO 10 nm. In Test Example A3, a light absorption layer was formed in a multilayer of molybdenum 4 nm/ITO 45 nm/molybdenum 70 nm/ITO 10 nm. In Test Example A4, a light absorption layer was formed in a multilayer of molybdenum 4 nm/ITO 45 nm/molybdenum 30 nm/ITO 10 nm. In Test Example B1, light absorption layer was formed in a multilayer of molybdenum 4 nm/SiO2 55 nm/molybdenum 35 nm/ITO 10 nm. In Test Example B2, a light absorption layer was formed in a multilayer of molybdenum 6 nm/SiO2 55 nm/molybdenum 35 nm/ITO 10 nm. In Test Example B3, a light absorption layer was formed in a multilayer of molybdenum 4 nm/SiO2 45 nm/molybdenum 70 nm/ITO 10 nm. In Test Example B4, a light absorption layer was formed in a multilayer of molybdenum 4 nm/SiO2 45 nm/molybdenum 30 nm/ITO 10 nm.

Referring to FIG. 9, it can be seen that Test Examples B employing SiO2 have a slightly higher light absorption rate than that of Test Examples A employing ITO.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A donor substrate comprising:
   a support layer;
   a first absorption layer disposed on the support layer;
   a buffer layer disposed on the first absorption layer, wherein the buffer layer comprises a transparent oxide film;
   a second absorption layer disposed on the buffer layer;
   a transfer layer disposed on the second absorption layer; and a reflection layer disposed on the support layer, wherein the reflection layer is patterned to form an opening, and the first absorption layer, the buffer layer, and the second absorption layer are disposed in the opening.

2. The donor substrate of claim 1 further comprising a protection layer disposed on the second absorption layer.

3. The donor substrate of claim 2, wherein each of the first absorption layer and the second absorption layer comprises at least one of molybdenum, chromium, tungsten, or titanium.

4. The donor substrate of claim 3, wherein the buffer layer comprises at least one of an indium-tin oxide film, an indium-zinc oxide film, or an oxide film comprising silicon.

5. The donor substrate of claim 4, wherein the transfer layer comprises an organic light emitting material.

6. A method of manufacturing an organic light emitting diode (OLED) display, the method comprising:
    forming a donor substrate including a support layer, a light absorption layer disposed on the support layer, and a transfer layer disposed on the light absorption layer, the light absorption layer comprising a first absorption layer, a buffer layer, and a second absorption layer, wherein the buffer layer comprises a transparent oxide film;
    forming a reflection layer on the donor substrate, wherein the reflection layer is patterned to form an opening, and wherein the first absorption layer, the buffer layer and the second absorption layer are formed in the opening;
    forming a pixel definition film and a pixel electrode on a transfer substrate;
    disposing the donor substrate on the transfer substrate to allow the transfer layer and the pixel electrode to face each other; and
    irradiating light to the donor substrate and forming an organic emission layer by transferring the transfer layer on the pixel electrode by heat of the light absorption layer.

7. The method of manufacturing of claim 6, further comprising forming a protection layer on the light absorption layer.

8. The method of manufacturing of claim 7, wherein the first absorption layer and the second absorption layer are each formed of at least one of molybdenum, chromium, tungsten, or titanium.

9. The method of manufacturing of claim 8, wherein the buffer layer is formed of at least one of an indium-tin oxide film, an indium-zinc oxide film, or an oxide film comprising silicon.

10. The method of manufacturing of claim 9, wherein the transfer layer includes an organic light emitting material.

11. The method of manufacturing of claim 9, wherein a wavelength of light ranges from about 400 nanometers to about 800 nanometers in the irradiating light to the donor substrate.

* * * * *